(12) United States Patent
Kang et al.

(10) Patent No.: US 6,322,685 B1
(45) Date of Patent: Nov. 27, 2001

(54) APPARATUS AND METHOD FOR PLATING COATINGS ON TO FINE POWDER MATERIALS AND USE OF THE POWDER THEREFROM

(75) Inventors: Sung Kwon Kang, Chappaqua; Sampath Purushothaman, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/078,043

(22) Filed: May 13, 1998

(51) Int. Cl.[7] .............................. C25D 17/16; C25D 7/00; H01B 1/02; B23K 31/00
(52) U.S. Cl. ...................... 205/143; 205/149; 252/500; 252/511; 252/512; 252/513; 252/514; 228/248.1
(58) Field of Search ..................................... 205/143, 149; 252/500, 511, 512, 513, 514; 228/248.1

(56) References Cited

U.S. PATENT DOCUMENTS

| | | | |
|---|---|---|---|
| 4,857,233 | * | 8/1989 | Teichmann et al. ................ 252/513 |
| 5,062,896 | * | 11/1991 | Huang et al. ................... 106/287.19 |
| 5,667,884 | * | 9/1997 | Bolger ................................. 428/323 |
| 5,837,119 | * | 11/1998 | Kang et al. ............................ 205/74 |

FOREIGN PATENT DOCUMENTS 62-235498-A * 10/1987 (JP).

* cited by examiner

*Primary Examiner*—Edna Wong
(74) *Attorney, Agent, or Firm*—Thomas A. Beck; Daniel P. Morris (57) ABSTRACT

A method using an electrically nonconductive cathode chamber with at least part of its wall area rendered permeable to ions and electrolytic solutions; premixing a predetermined quantity of an electroconductive powder and a first electroplating solution; filling the cathode chamber with the solution/powder mixture and a plurality of electroconductive spheres; disposing an electroconductive cathode ball connection in contact with the spheres and powder particles; securing the cathode chamber to a cap which is part of a rotary assembly that allows the rotation of the cathode chamber about its axis without twisting the aforementioned cathode ball connection positioned within said chamber; placing the cathode chamber within an anode chamber containing a second electroplating solution and an anode; rotating the cathode chamber on its axis using the rotary assembly; biasing the anode with a positive voltage in reference to the cathode ball connection causing the electroplating of a metallic coating on the surface of the said powder while it is tumbled within the rotating cathode chamber; and rinsing, cleaning, and optionally ball milling the mixture of plated powder particles and the spheres to enable easy recovery of the plated powder.

40 Claims, 6 Drawing Sheets

APPARATUS AND METHOD FOR PLATING COATINGS ON TO FINE POWDER MATERIALS AND USE OF THE POWDER THEREFROM

FIELD OF THE INVENTION

The present invention is directed to a method of producing metal powders useful in pastes for forming electroconductive connections between electroconductive members, and methods of use of the same in electronic applications.

BACKGROUND

Most electrical conductors used in electronic devices are made of metals, such as copper, aluminum, gold, silver, lead/tin (solder), molybdenum and others. Solder connection technology using lead/tin alloys plays a key role in various levels of electronic packaging, such as flip-chip connection (or C4), solder-ball connection in ball-grid-arrays (BGA), and IC package assembly to a printed circuit board (PCB) (TAB). Solder joints produced in the electronic packages serve critically as electrical interconnections as well as mechanical/physical connections. When either of the functions is not achieved, the solder joint is considered to have failed, which can often threaten a shut-down of the whole electronic system.

When microelectronic packages are assembled to a printed circuit board, the lead-tin eutectic solder, 63%Sn—37%Pb, having the lowest melting point (183° C.) among Pb—Sn alloys, is most widely used. In these applications, there are two solder connection technologies employed for mass production: plated-through-hole (PTH) and surface mount technology (SMT) soldering. The basic difference between the two technologies originates from the difference in the PCB design and its interconnection scheme.

In SMT soldering, microelectronic packages are directly attached to the surface of a PCB. A major advantage of SMT is high packaging density, which is realized by eliminating most PTH's in the PCB as well as by utilizing both surfaces of the PCB to accommodate components. In addition, SMT packages have a finer lead pitch and a smaller package size compared to traditional PTH packages. Hence, SMT has contributed significantly in reducing the size of electronic packages and thereby the volume of the overall system.

In SMT soldering, solder paste is applied to a PCB by screen printing. Solder paste consists of fine solder powder, flux, and organic vehicles. During the reflow process, solder particles are melted, flux is activated, solvent materials are evaporated, and simultaneously molten solder coalesces and is eventually solidified. In contrast, in the wave soldering process, a PCB is first fluxed and components are mounted on it. Then it is moved over a wave of molten solder.

The soldering process is usually completed by subjecting the solder joints to a cleaning step to remove residual flux materials. Due to environmental concerns, CFCs (chlorofluoro carbons) and other harmful cleaning agents used for this purpose are being eliminated and water-soluble or no-clean flux materials are being used to minimize or eliminate the cleaning steps.

Recent advances in microelectronic devices demand a very fine pitch connection between electronic packages and a printed circuit board (in an order of a few hundred micrometer pitch). The current solder paste technology used in SMT can not handle this very fine pitch interconnection due to the soldering defects such as bridging or solder balling. Another technical limitation of using the Pb—Sn eutectic solder is its high reflow temperature, approximately 215° C. This temperature is already higher than the glass transition temperature of the epoxy resin used in most polymeric printed circuit board materials. Thermal exposure at this reflow temperature produces significant thermal strains in a printed circuit board after soldering, especially in the direction perpendicular to the surface of a PCB, because no structural reinforcement is made in that direction. Thereby, the residual thermal strains in an assembled PCB could significantly degrade the reliability of an electronic system.

A more serious concern regarding the usage of lead (Pb)-containing solders is an environmental issue, a trend already experienced in other industries and has led to the elimination of lead from gasoline and paints.

Figure 1:
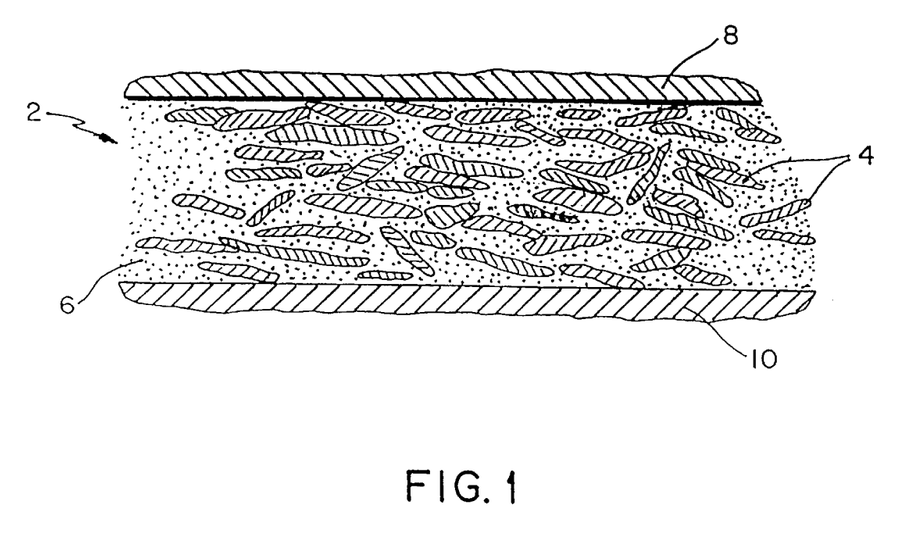
FIG. 1 is a schematic illustration of an electrically conductive paste comprising silver flake particles as a filler in the matrix of epoxy resin. The conductive paste is classified as isotropic in electroconduction.
Figure 2A:
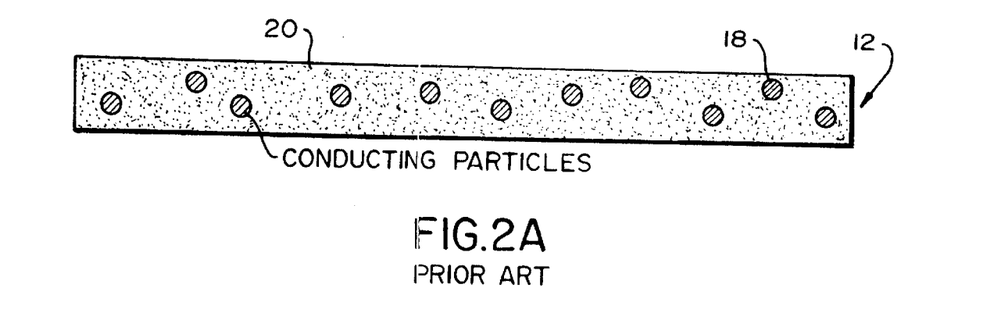
FIGS. 2A–B are schematic illustrations of an electrically conductive adhesive which becomes electrically conductive only in the one direction when the adhesive film is compressed between two contact or bond pads. The conductive adhesive (or film) is classified as anisotropic.
Figure 2B:
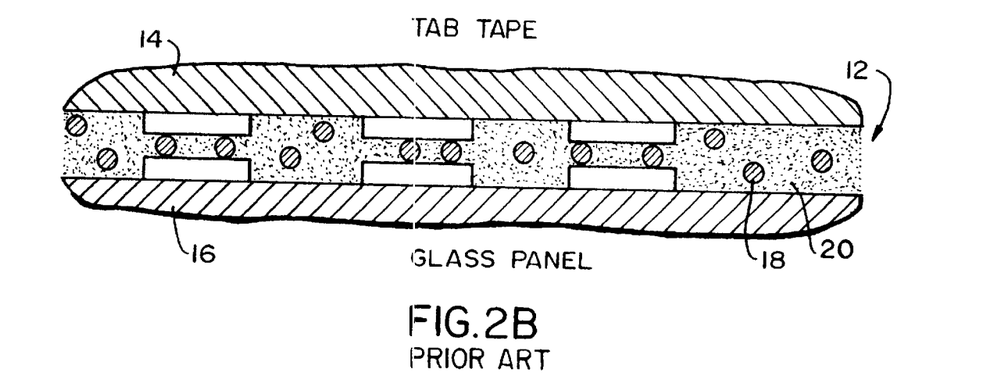

In the electronic industry, two different groups of materials are investigated currently for the possibility of substituting the Pb-containing solder materials; Pb-free solder alloys, and electrically conductive pastes (ECP). The present invention discusses the development and applications of the electrically conductive paste materials. An electrically conductive paste (or adhesive) is made of metallic filler particles loaded in the matrix of a polymer material. The polymer matrix can be any polymer suitable for use in a paste, for example, a thermoplastic of thermoset. The polymer is selected preferably from the group comprising epoxy, polyester and polyimide. The soluble epoxy, in particular, soluble ketal and acetal diepoxides, as described in U.S. application Ser. No. 08/210,879, filed Mar. 18, 1994, now U.S. Pat. No. 5,512,613, the teaching of which is incorporated herein by reference can also be used as the polymer matrix. Referring to FIG. 1, silver-particle 2 filled epoxy 4 is the most common example of the electrically conductive pastes 6, schematically shown therein as disposed between surface 8 and surface 10. The silver particles usually in the shape of flakes provide electrical conduction by percolation mechanism, while the epoxy matrix provides adhesive bond between the components and a substrate. This silver-filled epoxy material has been long used in the electronic applications as a die-bonding material, where its good thermal conduction rather than electrical conduction property is utilized. However, this material has not been accepted for the applications requiring high electroconduction and fine pitch connection. The silver-filled epoxy material has several limitations, such as low electrical conductivity, increase in contact resistance during thermal exposure, low joint strength, silver migration, difficulty in rework, and others. Since this silver-filled epoxy material is electrically conductive in all the directions, it is classified as "isotropic" in electro-conduction. There is another class of electrically conductive adhesive (or film), which provides electroconduction only in one direction. This class of the materials is known as "anisotropic" conductive adhesive film 12, shown schematically in FIG. 2A, which contains electrically conductive particles 18 in a binder or adhesive material 16. The anisotropic conductive adhesive or film 12 becomes conductive only when it is compressed between two conducting surfaces 14 and 16 as shown in FIG. 2B. This process normally requires heat and pressure. The major application of the anisotropic conductive film is for joining of a liquid crystal display panel to its electronic printed circuit board. The conducting particles 18 are usually deformable, such as solder balls, or plastic balls coated with nickel and gold. The binder or adhesive material 16 is mostly a thermosetting resin.

The ECP made of Sn-plated Cu powder and polyimide-siloxane resin disclosed in our earlier patent application, Ser.

No. 08/641,406, filed May 7, 1996, now U.S. Pat. No. 5,853,593, is a good candidate for the high temperature solder joints such as controlled collapse chip connections (C4) and solder ball connection (SBC) to a ceramic substrate. However, for the polymeric printed circuit board applications, this ECP is not adequate, because the reflow temperature such as 250° C. is much higher than the glass transition temperature of the polymeric resin, for example, FR-4. Candidates for this purpose are ECP's made of Cu powder plated with indium, tin-bismuth alloys or indium-tin alloys, formulated with polyimide-siloxane resin. The reflow temperature of these powder pastes is expected to be between 120 and 180° C., which is even lower than the reflow temperature of the Pb/Sn eutectic solder, 215° C.

In an earlier patent application Ser. No. 08/689,553, filed Aug. 9, 1996, now U.S. Pat. No. 5,837,119, we have disclosed a process to produce dendritic copper powder overcoated with Sn or Sn and BiSn coatings by electrolytic plating on a rigid inert cathode. The morphology of the powder that can be made by this technique is restricted to the dendritic shape which is not always the preferred one for all ECP applications.

A solder/polymer composite paste material is disclosed in U.S. Pat. No. 5,062,896 (Huang et. al.), comprising a major proportion of a meltable solder powder filler, such as Bi—Sn, Pb—Sn, Bi—Sn—Pb alloys, a minor proportion of a thermoplastic polymer such as a polyimide siloxane, and a minor proportion of a fluxing agent. An oxide-free, partially coalesced solder alloy connection is obtained, which is polymer strengthened and reworkable at a low reflow temperature, per se, or in the presence of polymer solvent.

In U.S. Pat. No. 5,286,417 (Mahmoud et. al.), a fusible conductive adhesive is disclosed, which comprises metal alloy fillers such as Sn—Au and Bi—Au, and a thermoplastic polymer having a glass transition temperature overlapping the melting temperature of the metal filler alloys. The loading of the conductive material in the polymer is in the range of about 15% to about 20% by weight.

In U.S. Pat. No. 5,136,365 (Pennisi et. al.), an adhesive material is disclosed, which contains a fluxing agent and metal particles for use in reflow soldering such as Sn, Pb, In, Bi, Sb, Ag and others, in the matrix of an epoxy resin. Upon reflow soldering, the said adhesive forms anisotropic electroconduction between an electrical component and a substrate.

In U.S. Pat. No. 5,213,715 (Patterson et. al.), a directionally conductive polymer is disclosed, which contains a metallic filler powder of Ni or Cu. The metallic powder is treated by a different polymer than the polymer used as a matrix resin. Upon compression, the coated polymer dissolves to make an electrical conduction among the filler particles.

In a previous patent application U.S. patent application Ser. No. 09/111,155 filed Jul. 7, 1998, we have disclosed a method to plate fine powder materials using a shaker plating method wherein the powder is placed in contact with a cathode surface and moved over it by a shaking action during the plating process.

OBJECTS

It is an object of the present invention to coat free standing metallic powder of any desired shape, morphology and size with a surface coating of a metal or an alloy by electroplating.

It is another object of this invention to provide a plating apparatus and method that can be scaled up to produce large batches of coated powder.

It is yet another object of the present invention to provide a method of fabricating an electrically conductive paste material which is environmentally safe and low cost.

It is another object of the present invention to provide a method of fabricating an electrically conductive paste material which produces a higher electrical conductivity than the conventional silver-filled epoxy does.

It is another object of the present invention to provide a method of fabricating an electrically conductive paste material which can be processed at a lower temperature than the reflow temperature of Pb—Sn eutectic solder paste.

BRIEF DESCRIPTION OF THE DRAWINGS

Further objects, features, and advantages of the present invention will become apparent from a consideration of the following detailed description of the invention when read in conjunction with the drawing FIGs., in which.

SUMMARY OF THE INVENTION

A broad aspect of the present invention is a method including the steps of disposing a powder with a conducting surface in a plating solution contained in a barrel cell which is impermeable to the powder and selectively permeable to the plating solution and the ions contained therein; providing a cathode contact ball; further providing a multiplicity of conducting spheres in the same cell to facilitate extended electrical contact between the cathode ball and the powder; disposing the said barrel in a bigger anode container filled with a second electrolyte; disposing an anode in the said anode chamber; providing a means to turn the barrel on its axis so as to produce a tumbling action to ensure mixing and contact of the powder particles with the conducting spheres and the cathode ball; applying an electrical potential such that the anode is positive with respect to the cathode to set up current flow through the electrolyte and the permeable cell wall to facilitate electrolytic plating of the desired coating from the solution on to the powder particles.

A second aspect of the present invention is to produce a powder with two or more layers applied by successive combinations of electroless plating and electroplating as described in the preceding paragraph to achieve a more versatile combination of coating properties.

In a more particular aspect of this invention, the coated powder and the conducting spheres are separated from the solution, rinsed, subjected to tumbling in a ball mill to recover the coated powder from the said spheres and dried and used to formulate electrically conducting adhesives by mixing with a polymer resin dissolved in a suitable solvent.

DETAILED DESCRIPTION

Figure 3:
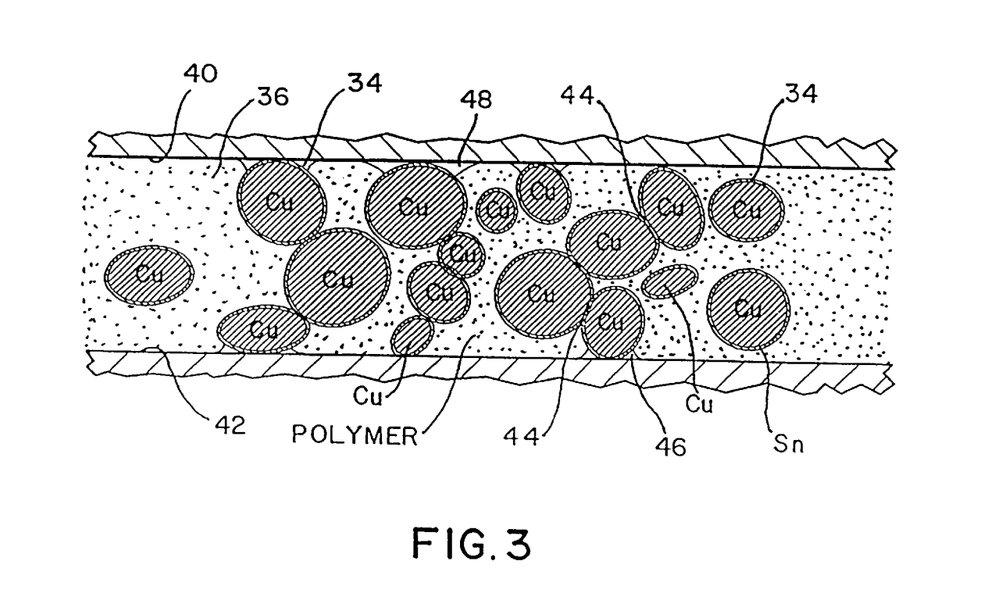
FIG. 3 is a schematic illustration of an electrically conductive paste material, comprising spherical copper powder filled in the matrix of thermoplastic polymer resin. The copper particles are coated with a low melting point, non-toxic metal such as tin, indium, bismuth, antimony or combinations thereof.

According to an embodiment of the present invention, an electrically conductive paste (ECP) material is disclosed, which consists of copper powder (or silver, gold, nickel, palladium, platinum, aluminum and alloys thereof) coated with a thin layer of low melting point, Pb-free metals selected from Sn, In, Bi, Sb Zn, or alloys thereof and their alloys, mixed with an environmentally-safe fluxing agent, and dispersed in the matrix of thermoplastic or thermosetting polymers. The microstructure of the ECP containing SnBi coated Cu powder is shown schematically in a cross-section view in FIG. 3.

In one particular embodiment, we disclose a new electrically conductive paste material consisting of copper powder coated with a tin bismuth alloy, polyimide-siloxane, solvent (acetophenone or n-methyl pyrrolidine) and a carboxylic acid/surfactant. The tin/bismuth coated copper powder is produced by simultaneous electrodeposition of tin and bismuth atoms as an alloy from a commercial electroplating solution produced by Lea Ronal Corporation using the special apparatus illustrated in FIG. 4.

Figure 4:
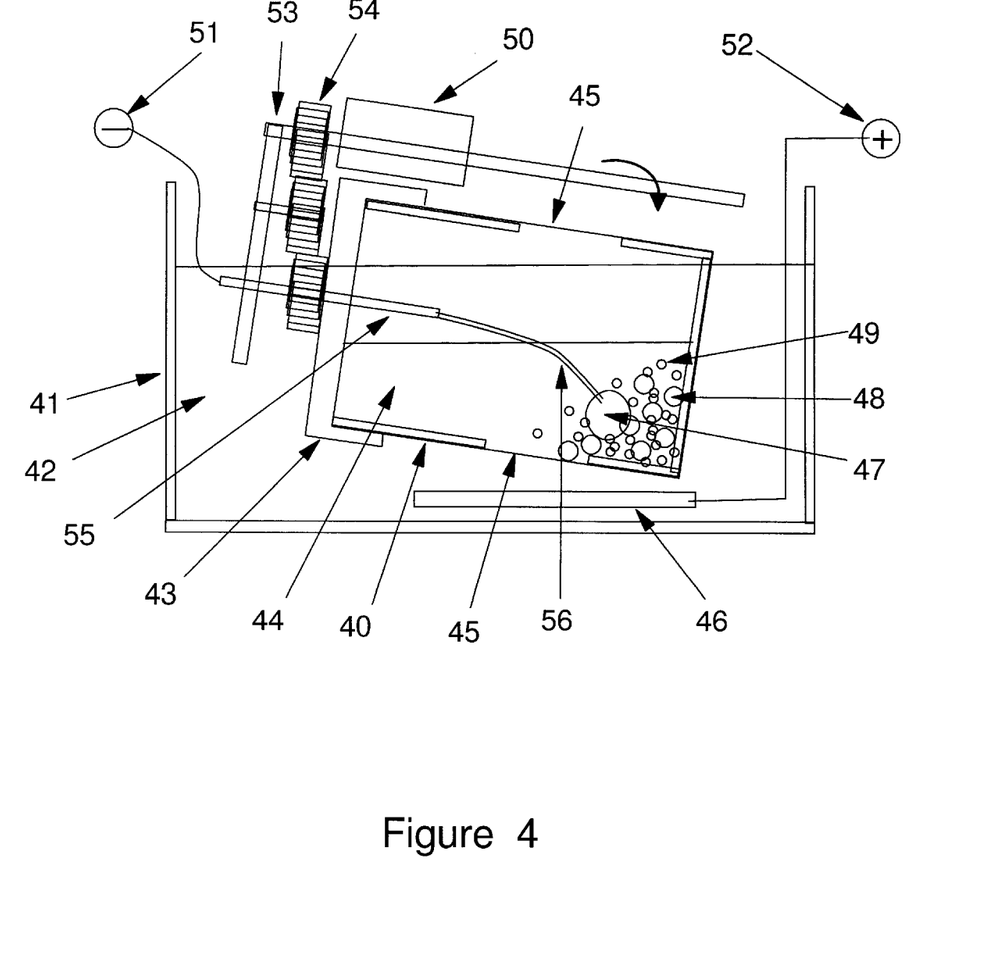
FIG. 4 is a schematic illustration of the apparatus used to electrolytically deposit thin metal or alloy coatings on fine copper powder.

The apparatus comprises a cathode container 40 predominantly made of a nonconductive material such as polypropylene, high density polyethylene polyvinyl chloride and polytetrafluoroethylene or the like, provided on at least part of the wall surface 45 with a separate membrane or a chemical modification of the container wall such that electrolytic solutions can permeate through that area while powder particles bigger than about 2 micrometers diameter cannot. A polymer filter membrane with pore diameters less than 2 micrometers could be used for this purpose as item 45. The permeability of the cathode chamber may also be achieved using windows made of a microporous polymer film with pore sizes of 1 micrometer or less. A preweighed amount of conductive powder 49 to be coated is placed in the cathode chamber and the container is filled with a suitable electroplating solution 44 (in this case a SnBi plating solution) so as to partially fill the cathode chamber. Additionally, a quantity of conducting spherical balls 48 are added to the solution 44. The spheres 48 are required to be resistant to attack by the plating solution are typically made of stainless steel alloy 304, 410 or the like and are about 3 mm in diameter. The quantity of these spheres is determined experimentally to optimize the process as described later. The cathode barrel so filled is mounted on a rotary assembly 53 by means of a cap 43. The rotary assembly 53 is provided with a motor 50 that drives the gear assembly 54 that can turn the cathode container about its axis at a desired rate. The cap 43 is provided with an axial feedthrough 55 that acts as a conduit for connecting in the negative electrical terminal 51 to the cathode ball 47 through the insulating connecting wire 56. The cathode ball can be made of the same material as the spheres 48. The axial feed allows the cathode chamber to turn without twisting the cathode connection wire 56. The whole cathode assembly can be mounted at any desired angle with respect to the horizontal in order to facilitate powder flow within the cell during the rotation of the cathode chamber. The cathode assembly is placed at a slight angle (from 1 to 10 degrees) to the horizontal and immersed into a bath of electroplating solution in a second chamber 41 designated the anode chamber. An anode 46 is placed in the anode chamber 41. In the present application anode 36 is made of pure tin sheet; other suitable materials are: indium, zinc lead, bismuth, titanium, platinum and alloys thereof. Anode 46 connected by a suitable wire to the positive terminal 52.

The anode and cathode leads 52 and 51 are connected to the positive and the negative legs, respectively, of a dc power supply (for example Kepco Model JQE 0 to 6V/0 to 20 Amps). The cathode chamber is rotated about its axis using the motor and gear assembly and a dc voltage is applied across the positive 52 and negative 51 terminals causing a current to flow through the cell and plating to occur in the conducting surfaces in the cathode chamber. By ensuring that the quantity of spheres 48 is sufficient to ensure dispersion of the powder 49 and to allow continued contact between the cathode ball 47 and the powder 49, a steady plate up of a coating on the powder surface is achieved.

After the plating is performed for the requisite period of time, the dc power is switched off, the cathode chamber is removed from the cap and the solution decanted from the chamber. The coated powder and the spheres are then rinsed in deionized water and a suitable solvent such as isopropanol. The sphere/powder mixture is then transferred to a small ball mill, Spex mixer/mill 8000 (Spex Industries, Inc., Edison, N.J.), along with a small volume of the solvent and subjected to ball milling for a period of few minutes. This enables the separation of any powder attached to the spheres and causes separation of any agglomerated powder mass. Powder and the spheres are dried and separated readily by seizing.

The copper powder may be substituted with others such as nickel, cobalt, silver, palladium, platinum depending on the specific application. Alternatively, one can also use powder that is nonconducting in the bulk but provided with an electrically conductive surface layer. Metallized ceramic or polymer powder such as polytetrafluoroethylene, polysulfone, or polyimide, made of materials including polysulfone, polyimide, polytetrafluoroethyleme (teflon) are typical examples of these classes of materials. The tin/bismuth alloy coating can be replaced by other metals such as Sn, In, Zn, Pb, Bi and Sb or their alloys. Because the process can start with any powder size or aspect ratio, a wide variety of coated filler powders can be prepared.

When such a powder is formulated into an ECP, a joining operation can be performed near the melting point of Sn/Bi alloy which is about 140° C. resulting in sound metallurgical bonding between the particles themselves and between the particles and substrate contact pad surfaces on electronic devices and cards which are typically made of copper, copper/gold, nickel, nickel/gold, nickel/palladium, palladium, or palladium/gold platinum, aluminum and alloys thereof.

Alternately, a coating of indium (melting point 159° C.) or an alloy of indium and tin (melting point 120° C.) can be used as coatings on the copper particles to obtain bonding as described above. Since indium alloys have acceptable wettability on even hard to solder metals such as aluminum, titanium, molybdenum, or tungsten, the present invention material can be used as fillers in ECP's for joining of liquid crystal display devices. The joining process can be either solid-state or liquid-solid reaction. The polymer curing process can be combined with the joining process depending on the paste formulation so that both these can be achieved in a single bonding cycle. Because of the metallurgical bonding and the high conductivity copper core, a higher electrical conductivity is expected with the joints made of the new paste material than with those of the silver-epoxy material. The metallurgical bonds also provide stable electrical conductivity of the new joints upon thermal exposure and cycling. It is also expected to have a higher joint strength from the combined effect of the metallurgical and adhesive bonds. It should be noted that such bonding is achieved at significantly lower temperatures than what is currently practiced for PbSn eutectic solder assemblies (215° C.) thereby reducing the thermal stresses and the associated warpage that may occur in card substrates.

Some examples of the use of the metal powders of the present invention in admixture with a polymer and other additives to form a useful paste for forming electroconductive connections between electroconductive members in electronic applications are embodiments wherein the electoconductive paste is disposed between a first and a second electrically conductive surface. The first surface may be a chip contact location and the second may be a substrate contact location. In this application, the paste may be heated to a first temperature, to fuse a coating on adjacent powder particles and particles to the chip and substrate locations. Alternatively, the first electrically conductive surface is a liquid display panel contact and the second is a plastic lead location. Another method is to heat the paste to a temperature sufficient to cure the polymer in the admixture. The paste may be heated to a temperature sufficient to achieve fusing of the coated powder particles to themselves and to the contact locations and the curing of the polymer in a single step.

In another variant of the coating composition a low melting temperature and uniform coverage can be achieved in the following manner. A coating of a thin layer of Sn can be applied by electroless plating first on the copper powder as described in our earlier application, Ser. No., 08/641,406, filed May 1, 1996, now abandoned. This is followed by electroplating the SnBi alloy as described in the present invention. The combination would ensure complete coverage of all copper surfaces and provide a low melting coating alloy. In a more general variant, the coating can be any metal or alloy that can be coated on the powder by an electroless or electrolytic plating, with additional coating of metal or alloy that can be applied by electrolytic or electroless plating with the combination providing the desired lower melting point alloy.

The polymer component of the paste can be polymer resins prepared from renewable resources or bio-based materials after appropriate functionalization to achieve the desirable thermal and Theological properties. Lignin (by product from paper manufacture), cellulose, wood or crop oils are potential candidates for this purpose. Use of these materials is environmentally preferable because they are derived from natural and renewable resources and can be disposed of more readily at the end of the useful life of the electronic assembly. This is particularly attractive because the use of the coated copper powder as filler eliminates the use of lead (Pb) containing solders and the resulting paste formulation is non-toxic and easy to dispose.

Our previous application, Ser. No. 08/326,626 filed on Oct. 24, 1994, now abandoned, the teaching of which is incorporated herein by reference teaches using tin-coated copper powder as a filler material in formulating an electrically conductive paste. The copper powder has a spherical morphology, which can be produced by either powder atomization or electrodeposition process. Tin coating is performed on copper powder by using an electroless immersion Sn plating solution.

Since there is no commercial immersion plating process available for many of the coating metals of interest, specifically indium, bismuth and antimony, coating of copper powder by a process similar to tin-coating on copper powder described above is not possible.

The process and structure of the present invention provides the solution to the above problems through an electroplating method to coat In, Bi, Sb, Sn and Pb or alloys thereof on free standing powder particles. The method is also applicable to other metal coatings that cannot be obtained easily by electroless plating.

EXAMPLE 1

About 5 gms of copper powder nominally 5 to 10 micron diameter supplied by SCM Metals Corporation, Research Triangle Park, N.C., was presoaked in about 30 ml of SnBi alloy plating solution purchased from LeaRonal Corporation to remove the native surface oxide, as well as to prewet the surface. The mixture was transferred to the cathode chamber of our apparatus along with 20 gms of stainless steel spheres 0.125" diameter were added. An additional 400 ml of the plating solution was added to the cathode chamber and the contents were stirred together. The cathode chamber was then attached to the rotary assembly ensuring that the cathode ball was in place within the cathode chamber and in contact with the bed of stainless steel spheres. This cathode assembly was then placed within an outer plexiglass tank containing about 3 liters of the SnBi plating solution and a 0.125 thick tin (99.99% pure) sheet anode. The cathode chamber was set up so that it was at a tilt of about 5 to 10 degrees from the horizontal. It was ensured that the liquid level within the cathode chamber was below that in the outer tank in order that influx of solution from the outer tank can be facilitated. The gap between the anode sheet at the bottom of this anode tank and the cathode chamber was about 10 to 15 mm. The motor of the rotary assembly was set to turn the cathode assembly at about 20 rpm. Connections were made from the cathode lead to the negative terminal and the anode lead to the positive terminal of a dc power supply (Kepco JQE 0 to 6V, 0 to 20A) and plating was started. A nominal current of 5A was achieved while the cell voltage varied from 2 to 5 V as the cathode chamber turned. Plating was carried out for 30 minutes. The power supply was turned off, the leads disconnected, and the plating cell disassembled. The used plating solution was pipetted out, the powder and spheres rinsed thoroughly in deionized water and isopropanol to eliminate any residual plating chemicals. The mixture was then scooped out of the cathode chamber and subjected to ball milling in isopropanol medium. The spheres and plated powder were then dried and separated by sieving. Particles of plated powder in the 5 to 30 micrometer range were then collected for further analysis.

Figure 5:
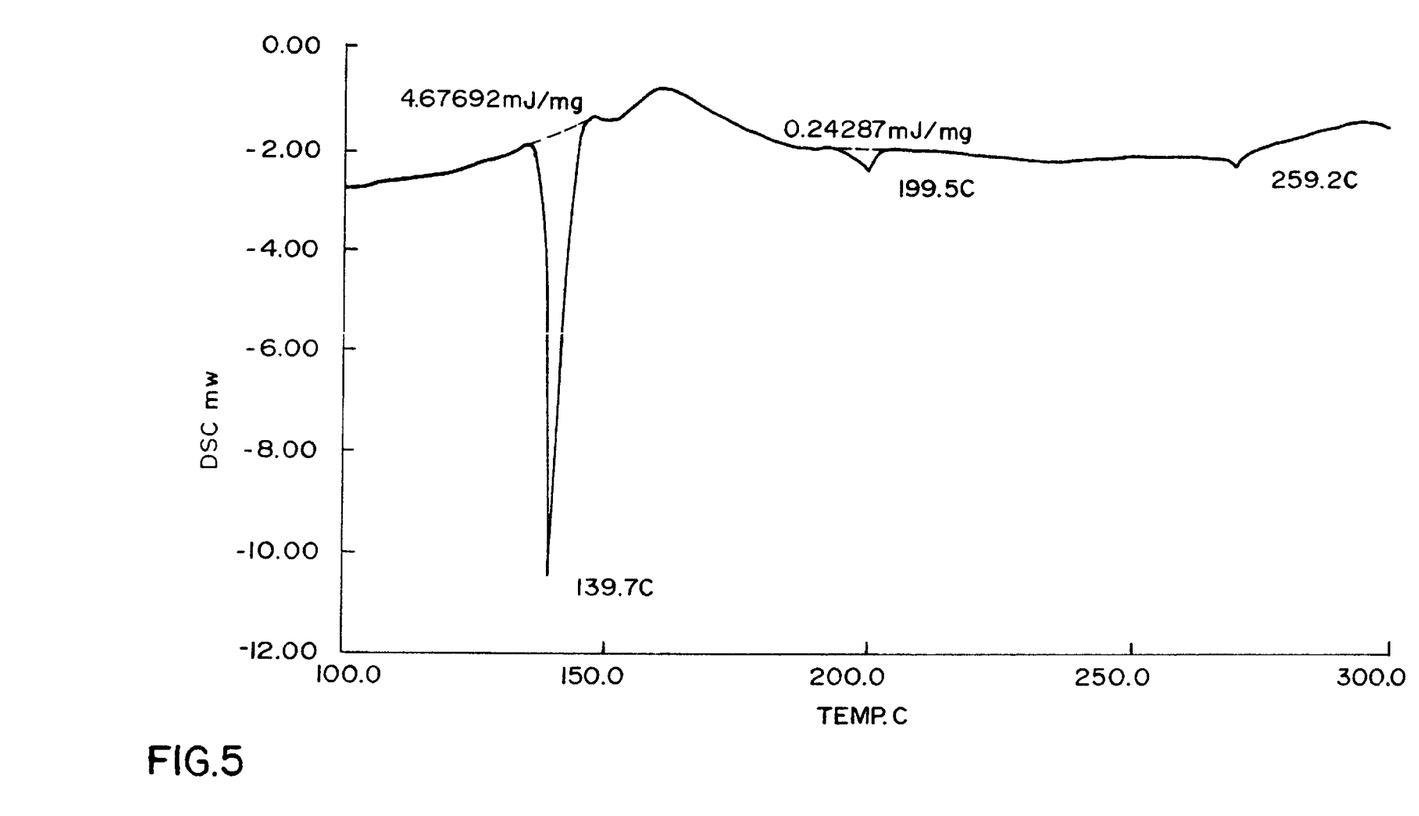
FIG. 5 is a differential scanning calorimeter (DSC) scan of the SnBi plated copper powder showing the three distinct melting processes that occur in the coating layer.

A small sample of the powder (usually 10 mg) was loaded into a Model SSC/5200 differential scanning calorimeter (DSC) made by Seiko Inc. The sample was heated at a rate of 10 degrees C. per minute from room temperature to 350° C. to monitor the melting processes that occur in the material. FIG. 5 shows a typical DSC scan indicating a major endothermic peak around around 140° C., which corresponds to the BiSn eutectic composition. In addition, there are two minor endothermic peaks corresponding to a off-eutectic bismuth rich SnBi alloy that melts at 200° C. and the pure bismuth phase at 270° C. It is important to note that the surface coating has an incipient melting point of 140° C.

Figure 6:
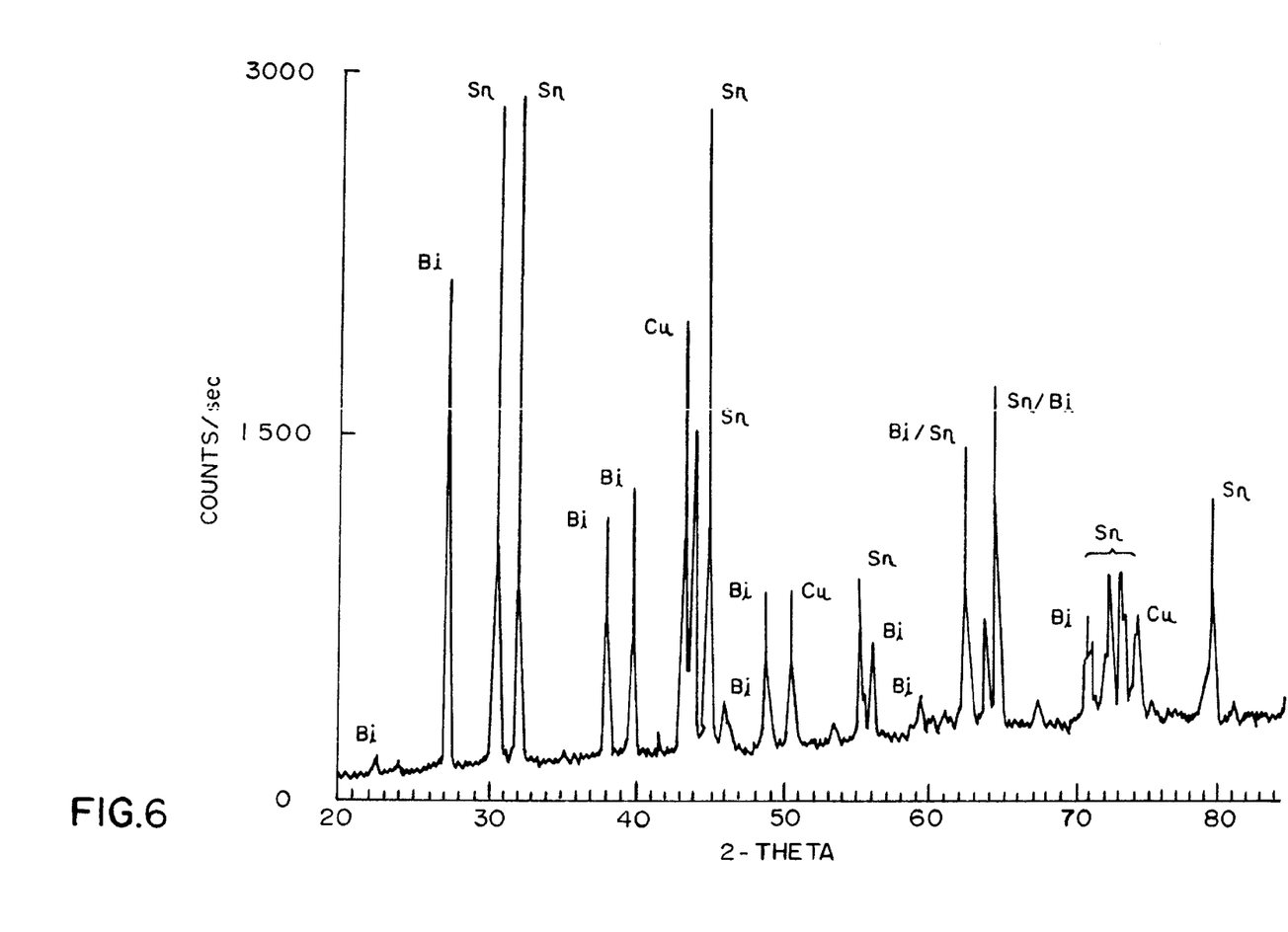
FIG. 6 is an x-ray diffractogram of the SnBi plated copper powder showing the presence of peaks characteristic of crystalline copper, tin and bismuth.

A small amount of the plated powder was sprinkled on a glass slide with a double stick adhesive tape on it, to make a thin bed of powder. The sample was then loaded in to a Philips X-ray diffractometer and a 2θ x-ray diffraction scan was performed to identify characteristic peaks of the crystalline phases in the powder. A typical scan shown in FIG. 6, indicates that diffraction peaks corresponding to Cu, Sn and Bi are present and the copper coverage by the SnBi coating is good. Thus it was concluded that the above described procedure produces fine copper powder overcoated with a SnBi alloy layer with a lowest melting point of 140° C.

EXAMPLE 2

BiSn-plated copper powder was used to formulate a conducting paste by mixing with polyimide siloxane resin dissolved in a solvent of N-methyl-pyrrolidinone (NMP), acetophenone, or ethyl benzoate, and a no-clean flux, FLUX305, from Qualitek International, Inc., Addision, Ill. The relative amount of the filler powder over the polymer resin varied from 30 to 90% in weight, depending on a specific application. To insure uniform dispersion of the ingredients, the mixture was processed in a three-roll shear mill. When the filler weight percent is low, a solvent drying process, for example, 100° C., 1 h, is required to adjust the viscosity of the paste before dispensing the paste on to a desired foot print.

In order to characterize the electrical and mechanical properties, model joint samples made of the BiSn-plated filler conductive paste were manufactured by laminating two "L-shaped" copper coupons. The lamination was performed at a temperature slightly above the melting point of BiSn coating, for example, 180° C., at a pressure of 25 psi. Contact resistance of the model joints were measured by four point probe method. The contact resistance values from a nominal joint area of 1.25 mm in diameter ranged from 1.4 to $4.0 \times 10^{-4} \Omega$. These values were equivalent to those of the model joints made with a commercial Ag-filled conductive paste. The shear strength of the model joints made of the BiSn-plated powder was in the range of 5.7 to 8.2 lb, which was comparable to or better than those of the commercial paste.

EXAMPLE 3

The BiSn-plated copper powder was used to formulate a conducting paste by mixing with phenoxy polymer or styrene allyl alcohol dissolved in a solvent of NMP, acetophenone, butyric acid, methyl benzoate, ethyl benzoate or propylene glycol methyl ether acetate (PGMEA), and a no-clean flux. The relative amount of the filler powder over the polymer resin varied from 30 to 90% in weight, depending on a specific application. To insure uniform dispersion of the ingredients, the mixture was processed in a three-roll shear mill. When the filler weight percent is low, a solvent drying process, for example, 100° C., 1 h, is required to adjust the viscosity of the paste before dispensing the paste on to a desired foot print.

In order to characterize the electrical and mechanical properties, model joint samples made of the BiSn-plated filler conductive paste were manufactured by laminating two "L-shaped" copper coupons. The lamination was performed at a temperature slightly above the melting point of BiSn coating, for example, 180° C., at a pressure of 25 psi. Contact resistance of the model joints were measured by four point probe method. The contact resistance values from a nominal joint area of 1.25 mm in diameter ranged from 0.8 to $2.4 \times 10^{-4} \Omega$. These values were better than those of the model joints made with a commercial Ag-filled conductive paste. The shear strength of the model joints made of the BiSn-plated powder was in the range of 8.3 to 10.5 lb, which was much better than those of the commercial paste.

While the present invention has been described with respect to preferred embodiments, numerous modifications, changes, and improvements will occur to those skilled in the art without departing from the spirit and scope of the invention.

What is claimed is:

1. A method comprising the steps of:

providing an electrically nonconductive cathode chamber with at least part of its wall area rendered permeable to ions and electrolytic solutions;

premixing a predetermined quantity of electoconductive powder and a first electroplating solution;

filling said cathode chamber with said powder mixture and a plurality of electroconductive spheres;

disposing an electroconductive cathode ball connection in contact with said spheres and powder particles;

securing said cathode chamber to a cap which is a part of a rotary assembly that allows the rotation of said cathode chamber about its axis without twisting the cathode ball connection positioned within said chamber;

placing the cathode chamber within an anode chamber comprising a second plating solution and an anode;

rotating the cathode chamber on its axis using the rotary assembly;

biasing said anode with a positive voltage in reference to said cathode ball connection causing the electroplating of a metallic coating on the surface of said powder while it is tumbled within the rotating cathode chamber;

and rinsing, cleaning and optionally ball milling the mixture of the plated powder particles and the spheres to enable easy recovery of the plated powder.

2. A method according to claim 1, wherein said powder is electrically conducting in the bulk.

3. A method according to claim 2, wherein said powder is selected from the group consisting of copper, silver, gold, nickel, palladium, platinum, aluminum and alloys thereof.

4. A method according to claim 1, wherein said powder is nonconducting in the bulk but possesses a surface layer that is electrically conductive.

5. A method according to claim 4, wherein the powder is made of polymeric materials selected from the group consisting of polytetrafluoroethylene, polysulfone and, polyimide and provided with a conducting surface layer of copper, silver, nickel, gold, palladium, platinum, aluminum or alloys thereof.

6. The method according to claim 1 wherein said metallic coating is a thin conductive coating of a low melting point metal or an alloy on said powder.

7. The method according to claim 6, wherein said thin low melting coating is selected from the group consisting of indium, tin, bismuth, antimony, zinc and alloys thereof.

8. A method according to claim 1, wherein the cathode chamber is selected from the group consisting of polypropylene, polyvinyl chloride, high density polyethylene and polytetrafluoroethylene.

9. A method according to claim 1, wherein said anode is selected from the group consisting of indium, tin, lead, zinc, bismuth, titanium, platinum and alloys thereof.

10. A method according to claim 1, wherein said permeability of the cathode chamber is achieved using windows made of a microporous polymer film with pore sizes of 1 micrometer or less.

11. The method defined in claim 1 wherein an electrically conducting paste is prepared and wherein said electrically conducting paste comprises a mixture of said plated powder particles with a suitable polymer resin dissolved in a solvent, butyric acid and no-clean flux.

12. A method according to claim 11, wherein said polymer resin is selected from the group consisting of polyimides, polyimide-siloxanes, siloxanes, phenoxy polymers, styrene allyl alcohol, epoxies, soluble epoxy with a ketal and acetal diepoxides, bio-based resins made from lignin, cellulose, wood oils and crop oils.

13. A method according to claim 11, wherein said solvent is selected from the group consisting of n-methyl pyrrolidinone, acetophenone, methyl benzoate, ethyl benzoate, and propylene glycol methyl ether acetate (PGMEA).

14. The method according to claim 11, wherein said paste is used by being disposed between a first electrically conductive surface and a second electrically conductive surface.

15. A method according to claim 14, wherein said first electrically conductive surface is a chip contact location and said second electrically conductive surface is a substrate contact location.

16. A method according to claim 15, wherein said paste is heated to a temperature to fuse said coating on adjacent powder particles and particles to the chip and substrate contact locations.

17. The method according to claim 14, wherein said first electrically conducting surface is a liquid crystal display panel contact and said second electrically conductive surface is a metallic lead location.

18. The method according to claim 11, wherein said paste is heated to a temperature sufficient to cure said polymer resin.

19. A method comprising the steps of:
 precleaning a powder with a conducting surface in a suitable solution to remove surface oxides;
 immersing and agitating the clean powder in an electroless plating solution at a temperature sufficient to achieve a deposition of a thin metallic layer on said powder surface to form an electroconductive powder;
 cleaning and drying the powder;
 providing an electrically nonconductive cathode chamber with at least part of its wall area rendered permeable to ions and electrolytic solutions;
 premixing a predetermined quantity of said electroconductive powder and a first electroplating solution;
 filling said cathode chamber with said powder mixture and a plurality of electroconductive spheres;
 disposing an electroconductive cathode ball connection in contact with said spheres and powder particles;
 securing said cathode chamber to a cap which is part of a rotary assembly that allows the rotation of said cathode chamber about its axis without twisting said cathode ball connection positioned within said chamber;
 placing the cathode chamber within an anode chamber comprising a second electroplating solution and an anode;
 rotating the cathode chamber on its axis using the rotary assembly;
 biasing said anode with a positive voltage in reference to said cathode ball connection causing the electroplating of a metallic coating on the surface of said powder while it is tumbled within the rotating chamber;
 and rinsing, cleaning, and optionally ball milling the mixture of plated powder particles and the spheres to enable easy recovery of the plated powder.

20. A method according to claim 19, wherein said powder is electrically conducting in the bulk.

21. A method according to claim 20, wherein said powder to be precleaned is selected from the group consisting of copper, silver, gold, nickel, palladium, platinum, aluminum and alloys thereof.

22. A method according to claim 19, wherein said powder is nonconducting in the bulk but possesses a surface layer that is electrically conductive.

23. A method according to claim 22, wherein the powder is made of polymeric materials selected from the group consisting of polytetrafluoroethylene, polysulfone and, polyimide and provided with a conducting surface layer of copper, silver, nickel, gold, palladium, platinum, aluminum or alloys thereof.

24. The method according to claim 19 wherein said thin metallic layer applied by electroless immersion provides full coverage of the powder surface.

25. The method according to claim 24 wherein said thin metallic layer is selected from the group consisting of tin, copper, silver, gold, palladium, nickel and alloys thereof.

26. The method according to claim 19 wherein said electroplating solution in said cathode chamber is used to produce a metallic coating of a low melting point metal or an alloy on said thin metallic layer on said powder surface.

27. The method according to claim 26 wherein said second metallic coating is selected from the group consisting of indium, tin, bismuth, antimony, zinc, and alloys thereof.

28. The method according to claim 19 wherein said thin metallic layer resulting from said electroless solution and said coating resulting from said electroplating solutions intermix to form lower melting alloys.

29. A method according to claim 19, wherein the cathode chamber is selected from the group consisting of polypropylene, polyvinyl chloride, high density polyethylene and polytetrafluoroethylene.

30. A method according to claim 19, wherein said anode is selected from the group consisting of indium, tin, lead, zinc, bismuth, titanium, platinum and alloys thereof.

31. A method of making an electrically conducting paste comprising mixing said plated powder particles prepared in accordance with the method defined in claim 19, with a suitable polymer resin dissolved in a solvent, butyric acid and no-clean flux.

32. A method according to claim 31, wherein said polymer resin is selected from the group consisting of polyimides, polyimide-siloxanes, siloxanes, phenoxy polymers, styrene allyl alcohol, epoxies, soluble epoxy with a ketal and acetal diepoxides, bio-based resins made from lignin, cellulose, wood oils and crop oils.

33. The method according to claim 31 wherein said solvent is selected from the group consisting of n-methyl pyrrolidinone, acetophenone, methyl benzoate, ethyl benzoate, and propylene glycol methyl ether acetate (PGMEA).

34. The method according to claim 31, wherein said paste is used by being disposed between a first electrically conductive surface and a second electrically conductive surface.

35. A method according to claim 34, wherein said first electrically conductive surface is a chip contact location and said second electrically conductive surface is a substrate contact location.

36. The method according to claim 35 where said paste is heated to a single temperature to achieve fusing of said plated particles to themselves and particles to the contact locations and curing of said polymer resin all in one step.

37. The method according to claim 34, wherein said first electrically conducting surface is a liquid crystal display panel contact location and said second electrically conductive surface is a metallic lead location.

38. The method according to claim 31 wherein said paste is heated to a temperature sufficient to fuse said coating on adjacent powder particles and particles to a chip and substrate contact locations.

39. The method according to claim 31, wherein said electrically conducting paste is heated to a temperature sufficient to cure said polymer resin.

40. The method according to claim 19 where the paste is heated to a single temperature to achieve fusing of said plated powder particles to themselves and particles to contact locations and curing of a polymer all in one step.

* * * * *